(12) United States Patent
Kikokawa et al.

(10) Patent No.: US 6,388,546 B1
(45) Date of Patent: May 14, 2002

(54) METHOD AND APPARATUS FOR CASCADING FREQUENCY DOUBLERS

(75) Inventors: Masahiro Kikokawa, Tokyo (JP); Malcolm G. Stubbs, Ottawa (CA)

(73) Assignees: Her Majesty The Queen In Right of Canada as represented by The Minister of Industry through the Communications Research Centre, Ottawa (CA); The Communications Research Laboratory of the Ministry of Posts and Telecommunications, Japan, Koganei (JP)

( * ) Notice: Subject to any disclaimer, the term of this patent is extended or adjusted under 35 U.S.C. 154(b) by 0 days.

(21) Appl. No.: 09/390,576

(22) Filed: Sep. 3, 1999

(30) Foreign Application Priority Data

Sep. 4, 1998  (CA) .............................................. 2244507

(51) Int. Cl.[7] .......................... H01P 1/00; H03B 19/00; H03B 19/14; H03H 7/38
(52) U.S. Cl. ........................ 333/218; 333/32; 327/119; 327/122; 327/123; 455/314; 455/333
(58) Field of Search .................... 333/32, 218; 327/119, 327/123, 122; 455/313, 314, 323, 333

(56) References Cited

U.S. PATENT DOCUMENTS

| | | | |
|---|---|---|---|
| 3,662,294 A | 5/1972 | Jacobs et al. ................... 333/33 |
| 3,731,180 A | 5/1973 | Napoli et al. ................ 333/218 |
| 4,176,332 A | 11/1979 | Bachert ........................ 333/218 |
| 4,331,940 A | 5/1982 | Uwano ........................... 331/99 |
| 4,450,584 A | 5/1984 | Saka et al. .................... 455/325 |
| 4,491,809 A | 1/1985 | Noda et al. ..................... 333/35 |
| 4,531,236 A | 7/1985 | Ishihara ........................ 455/302 |
| 4,642,590 A | 2/1987 | Buijs ............................ 333/218 |
| 4,736,168 A | 4/1988 | Nagata ........................... 331/96 |
| 4,754,229 A | 6/1988 | Kawakami et al. .......... 330/277 |
| 5,352,990 A | 10/1994 | Goto ............................. 330/286 |
| 5,463,359 A | 10/1995 | Heaton ........................... 333/32 |
| 5,473,281 A | 12/1995 | Honjo ........................... 330/286 |
| 5,563,551 A | 10/1996 | Kashiwa ....................... 330/277 |
| 6,066,997 A | * 5/2000 | Matsugatani et al. ........ 333/218 |

FOREIGN PATENT DOCUMENTS

| | | | |
|---|---|---|---|
| JP | 62-247608 | * 10/1987 | .................. 333/218 |
| JP | 63-217803 | * 9/1988 | |
| JP | 63-281504 | * 11/1988 | |
| JP | 9-284051 | * 10/1997 | |

OTHER PUBLICATIONS

Ingo Schmale et al.; "A Stability–Ensuring Procedure for Designing High Conversion–Gain Frequency Doublers", 1998 IEEE Microwave Symposium Digest, vol. 2; Jun., 1998 pp. 873–876.*

(List continued on next page.)

*Primary Examiner*—Robert Pascal
*Assistant Examiner*—Barbara Summons
(74) *Attorney, Agent, or Firm*—Polster, Lieder, Woodruff & Lucchesi

(57) ABSTRACT

This invention provides a multistage frequency multiplier having a plurality of frequency doublers. Each doubler incorporates a three-terminal transistor device and is connected to an adjacent doubler via an interstage network. The network comprises a transmission line having its electrical parameters selected to achieve conjugate impedance matching at the intermediate harmonic frequency generated by the corresponding doubler. This network also includes a quarter-wavelength open-ended stub for suppressing a main input frequency component received by the corresponding frequency doubler. A shunt resistor on the transistor gate is preferably used to stabilize the network. This interstage network simplifies overall circuit topology to reduce total circuit size, and provides increased drive power levels to permit broader bandwidth and stabilize required output level from a local oscillator. This invention is particularly useful in high-speed, large-capacity communications systems and in microwave and millimeter-wave radar applications.

18 Claims, 9 Drawing Sheets

OTHER PUBLICATIONS

Kamogawa et al., "Injection–Locked Oscillator Chain: a Possible Solution to Millimeter–Wave Mmic Synthesizers," 1996 IEEE MTT–S Symposium Digest, pp. 517–520, Jun., 1996; vol. 20.

Suematsu et al., "Millimeter–Wave HBT MMIC Synthesizers Using Sub–Harmonically Injection–Locked Oscillators," 1997 IEEE GaAs IC Symposium Digest, pp. 271–274, Oct., 1997.

T. Takagi, et al., "A Millimeter–Wave Monolithic High Power Amplifier using a Novel Tandem FET", IEICE Trans. Electron., vol. E75–C, No. 6, pp. 669–673, Jun. 1992.

Isota et al., "Overview of Millimeter–Wave Monolithic Circuits," 27th European Microwave Conference Proceedings, pp. 1316–1322 (Sep. 1997).

H. Wang, et al., "A W–Band Source Module using MMICs," IEEE Trans. Microwave Theory Tech., vol. MTT–43, No. 5, pp. 1010–1016, May 1995.

Ninomiya et al., "60–GHz Transceiver for High–Speed Wireless LAN System," 1996 IEEE MTT–S Symposium Digest, pp. 1171–1174, Jun., 1996; vol. 2.

Hamada et al., "60 GHz Phase Locked Oscillator using Frequency Doubler", 1997 IEICE Spring Conference C–2–45.

* cited by examiner

METHOD AND APPARATUS FOR CASCADING FREQUENCY DOUBLERS

FIELD OF INVENTION

This invention relates to a method and an apparatus for multiplying the output frequency of an oscillator, and is particularly concerned with cascading frequency doublers to provide frequency sources in the microwave and millimeter-wave frequency bands.

BACKGROUND OF THE INVENTION

Emerging high-data-rate wireless communication systems in the Ka band, require highly-stabilized, low phase-noise signal sources, and the phase-locked oscillator (PLO) is considered a promising candidate. The construction of millimeter-wave PLOs, however, necessitates a complex circuitry consisting of several radio frequency (RF) components, often resulting in a cumbersome packaging and high total cost along with high DC power consumption. Recently, millimeter-wave injection-locked oscillators have been investigated to exploit low-GHz synthesizer sources comprised with low-cost ICs, as reported in:

Kamogawa et al., "Injection-locked oscillator chain: a possible solution to millimeter-wave MMIC synthesizers," 1996 IEEE MTT-S Symposium Digest, pp. 517–520; and Suematsu et aL, "Millimeter-wave HBT MMICs synthesizers using sub-harmonically injection-locked oscillators," 1997 IEEE GaAs IC Symposium Digest, pp. 271–274. These methods, using high multiplication factors, are also an attractive means of attaining better performance because the phase noise deterioration for frequency multiplication varies according to $f^2$, while the phase noise of microwave and millimeter-wave oscillators reportedly degrades according to $f^4$–$f^5$, as indicated in:

Isots et aL, "Overview of millimeter-wave monolithic circuits," 27th European Microwave Conference Proceedings, pp. 1316–1322 (Sept. 1997).

As an alternative to millimeter-wave PLOs, frequency multipliers have been conventionally employed following microwave PLOs. In order to achieve higher orders of multiplication, frequency multipliers are often constructed with chains of frequency doublers because frequency doubling has been preferred for its higher conversion efficiency. In such multipliers, diodes have been conventionally used as devices for frequency conversion, and is required the insertion of driving power amplifiers between doublers to compensate for the conversion losses accompanied by frequency multiplication.

Although possible conversion gain is expected by using transistors such as field-effect transistors (FETs), interstate amplifiers have been needed in high frequency ranges such as millimeter-wave frequencies where small-power devices have been used as reported in:

H. Wang, et aL, "A W-band source module using MMICs," IEEEE Trans. Microwave Theory Tech., Vol MTT-43, No. 5, pp. 1010–1016, May 1995.

Depending on the capabilities of the devices and the operating frequency, frequency doublers have been cascaded without driving amplifiers as reported in:

Ninomiya et aL, "60-GHz transceiver for high-speed wireless LAN system," 1996 IEEE MTT-S Symposium Digest, pp. 1171–1174; and Hamada et al, "60GHz phase locked oscillator using frequency doubler", 1997

IEICE Spring Conference C-2-45. However, in these systems, each stage has been an independent circuit whose input/output impedances are matched to 50 ohms at the respective frequencies.

A configuration of cascaded frequency doublers in accordance with the prior art is illustrated in FIG. 1. A first-stage frequency doubler 1 contains in a series connection a first input matching network 1a to provide 50 ohm matching for the fundamental frequency signal, a first transistor 1b, a first quarter-wavelength open-ended stub 1c for suppressing the fundamental frequency, followed by a first output matching network 1d to provide 50 ohm matching for the second harmonic frequency signal. A second-stage frequency doubler 2 contains in a series connection a second input matching network 2a to provide 50 ohm matching for the second harmonic frequency signal, a second transistor 2b, a second quarter-wavelength open-ended stub for 2c for suppressing the second harmonic frequency, followed by a second output matching network 2d to provide 50 ohm matching for the fourth harmonic frequency signal. U.S. Pat. No. 4,754,229 issued to Kawakami and Kudo on Jun. 28, 1988 describes a microwave design of a matching circuit having similar components to those shown in FIG. 1.

The configuration shown in FIG. 1 consists of cascaded frequency doublers where each stage is designed independently so that input/output impedances at each stage is matched to provide 50 ohm termination for its corresponding frequency. As a consequence, different stubs are required for matching 50 ohm in each input/output impedance matching network. Since relatively small-power devices are used, the power level is at most approximately 0 dBm. Employing medium-power transistors for increasing the driving power level results in the frequency bandwidth becoming narrower. This is because the input resistance of medium-power transistors, which is originally relatively low, is often even further lowered by a quarter-wavelength open-ended stub for suppressing the fundamental frequency, necessitating a larger transforming ratio to 50 ohm. For instance, a GaAs-based 500 $\mu$m PHEMT from Northrop Grumman Corporation shows the input resistance of approximately 5 ohm, hence the transforming ratio to 50 ohm is about 10. This ratio can become equivalently even higher by the effect of the quarter-wavelength open-ended stub. In the case of such large ratios, an additional impedance matching network may need to be employed if the circuit is to be terminated to 50 ohms with a sensible frequency bandwidth.

SUMMARY OF THE INVENTION

It is an object of the present invention to provide a method and an apparatus for multiplying the output frequency of an oscillator in low-frequency microwave bands.

It is another object of the invention to provide a highly stable, low-phase-noise local frequency source in microwave and millimeter-wave frequency bands.

Therefore, in accordance with an aspect of the present invention, there is provided a method of frequency multiplication comprising the steps of:

(a) receiving an input signal having a fundamental frequency component $f_0$;

(b) providing an input impedance matching to said fundamental frequency component;

(c) performing a plurality of n frequency doubling operations in series to derive from the input signal an output signal having an output frequency component of $2^n f_0$, wherein each frequency doubling operation, hereby referred to as k' th doubling operation K≦n, includes the steps of receiving a k' th input signal having an input frequency component of $2^{(k-1)}f_0$, deriving from the k' th input signal a k' th intermediate signal having a harmonic frequency component of $2^k f_0$, suppressing the input frequency component of $2^{(k-1)}f_0$ from the intermediate signal; and (d) providing an interstage impedance matching to the harmonic frequency component of $2^k f_0$ between each pair of consecutive k' th and (k+1)'th frequency doubling operations; and (e) providing an output impedance matching to the output frequency component of $2^n f_0$. Preferably, each doubling operation step further includes a step of signal stabilization after the step of receiving said input signal.

In accordance with another aspect of the present invention there is provided a multistage frequency multiplier comprising in a series configuration:

(a) an input network for receiving an input signal having a fundamental frequency component of $f_0$ and for providing impedance matching to said fundamental frequency component;

(b) a plurality of n frequency doublers, to derive from the input signal an output signal having an output frequency component of $2^n f_0$, wherein each frequency doubler, hereby referred to as a k' th doubler k<n, comprises means for receiving a k' th input signal having an input frequency component of $2^{(k-1)}f_0$, and deriving from said input signal a k' th intermediate signal having a harmonic frequency component of $2^k f_0$, and means for suppressing said input frequency component from the intermediate signal;

(c) a plurality of n-1 interstage networks, each positioned between a pair of adjacent k' th and (k+1)'th frequency doublers to provide an interstage impedance matching to the harmonic frequency component $2^k f_0$; and (d) an output network for impedance matching to the output frequency component of $2^n f_0$.

In one embodiment of this invention, n=2 such that when a fundamental frequency signal is applied to the input network means, a fourth harmonic signal is provided by the output network means. In another embodiment, n=3 such that when a fundamental frequency signal is applied to the input network means, an eighth harmonic signal is provided by the output network means.

In an embodiment of this invention, the frequency doubler comprises a three-terminal transistor device, which can be either a field effect transistor (FET) or a high electron mobility transistor (HEMT). Preferably, the suppressing means is a quarter-wavelength open-ended stub positioned from the transistor device output terminal by an electrical length suitable to provide a most effective suppression of the input frequency component of $2^{(k-1)}f_0$ and a most effective generation of the harmonic frequency component of $2^k f_0$. Practically, in many cases the electrical length is substantially zero. Also practically, the transmission line is a microstrip line which has electrical parameters which include characteristic impedance and electrical length, that are so selected as to achieve interstage impedance matching by making a pair of reflection coefficients thereof seen in opposite directions to one another have phases of substantially the same values and opposite polarities. Optionally the characteristic impedance is substantially 50 ohms. Yet another embodiment of this invention further comprises stabilization means at the input port, preferably formed of a shunt resistor.

This invention provides interstage matching within a multistage frequency multiplier, without a need for driving amplifiers between doublers therein. One advantage of the present invention is to simplify the circuit topology because the stubs for impedance matching are eliminated, resulting also in a reduction in the total size of the circuits. Another advantage is that when a cascading doubler uses medium power three-terminal transistors, drive power levels can be increased keeping the bandwidth from getting narrow, thereby providing the output power level required from a local oscillator. The apparatus and method of the invention are of particular use in high-speed, large-capacity communications systems and in microwave and millimeter-wave radar transmitters.

BRIEF DESCRIPTION OF THE DRAWINGS

Exemplary embodiments of the invention will now be further described with references to the drawings wherein:

FIG. 2b shows the elements of each of the interstage networks used in an embodiment of the configuration of FIG. 2a;

FIG. 3 shows in a circuit diagram the three-stage frequency multiplier illustrated in FIG. 2a;

DETAILED DESCRIPTION OF THE INVENTION

Figure 2A:
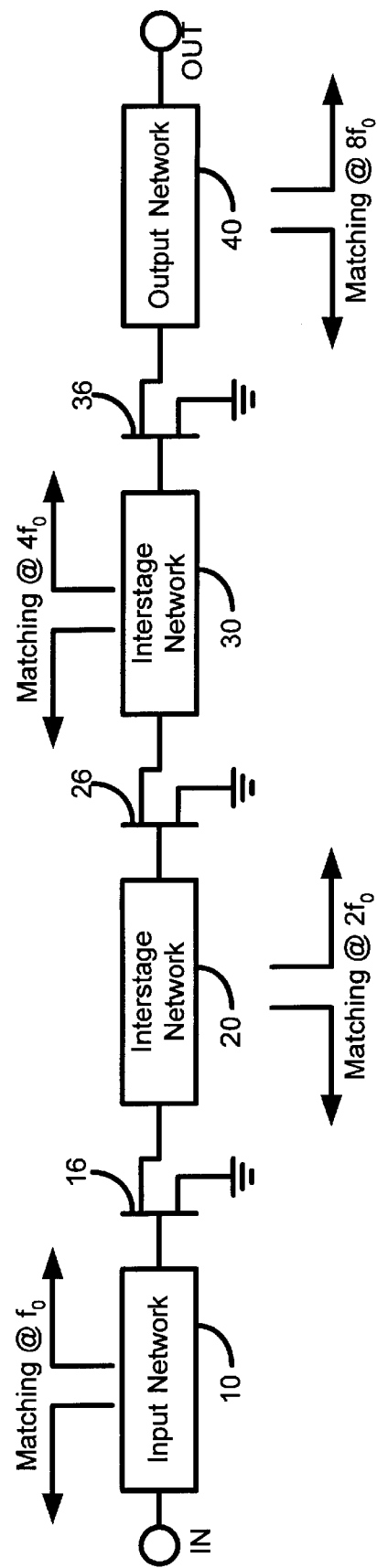
FIG. 2a illustrates in a block diagram a three-stage frequency multiplier configuration using two interstage networks in accordance with the present invention.

FIG. 2a illustrates in a block diagram the operating principles of a three-stage frequency multiplier configuration using two interstage networks in accordance with the present invention. The multiplier contains in a series configuration an input network 10, a first transistor 16, a first interstage network 20, a second transistor 26, a second interstage network 30, a third transistor 36, and an output network 40. Each of the four networks 10, 20, 30, and 40 provides an impedance matching for its corresponding frequency, i.e. the fundamental frequency $f_0$, the second harmonic $2f_0$, the fourth harmonic $4f_0$, and the eighth harmonic $8f_0$, respectively.

In general terms, a multistage frequency multiplier is stated as to include a plurality of n frequency doublers, to derive from the input signal an output signal having an output frequency component of $2^n f_0$, and each frequency doubler is then referred to as a k' th doubler k≦n, which receives a k' th input signal having an input frequency component of $2^{(k-1)}f_0$ and derives from it a k' th intermediate signal having a harmonic frequency component of $2^k f_0$.

Figure 2B:
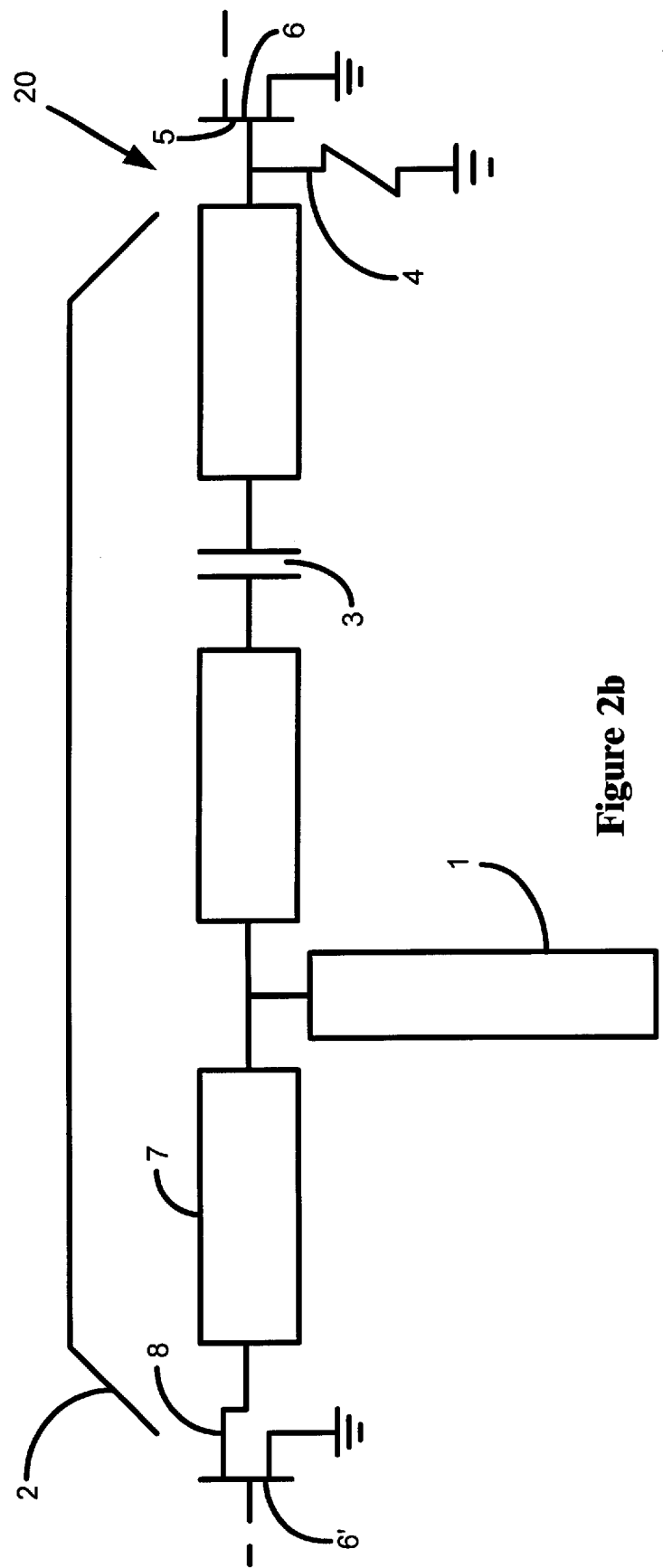

FIG. 2b shows the elements of an embodiment of each of the interstage networks 20 and 30 used in the configuration of FIG. 2a. Such an interstage network consists of a quarter-wavelength (λ/4) open-ended stub 1 for suppressing the main input signal component, coupled to a transmission line 2 including a DC block capacitor 3. A shunt resistor 4 coupled to the gate 5 of a frequency doubling transistor device 6 is used for stabilization when the input resistance of the next stage doubler is either close to zero or negative. The transistor device 6 is a three-terminal transistor biased in such a manner as to exploit the nonlinearity for the purpose of generating a second harmonic frequency. In this embodiment, the transistor device 6 is a field effect transistor (FET) or a high electron mobility transistor (HEMT), but other types can also be used, such as heterojunction bipolar transistors (HBTs). Impedance matching between the transistor devices of two successive stages is made by selecting the appropriate characteristic impedance of the transmission line 2 and its electrical length, to provide the required interstage conjugate impedance matching. In this embodiment, the transmission line 2 is formed of a microstrip line, but other transmission lines can be used, such as coplanar waveguides.

Although there is not much significance in their directions, the open-ended stubs 1 for impedance matching are indicated in the figures as pointing upwards, whereas the stubs for suppressing the input signals shown as pointing downwards. An open-ended stub is defined herein as a transmission line section that ends in an open circuit.

Figure 1:
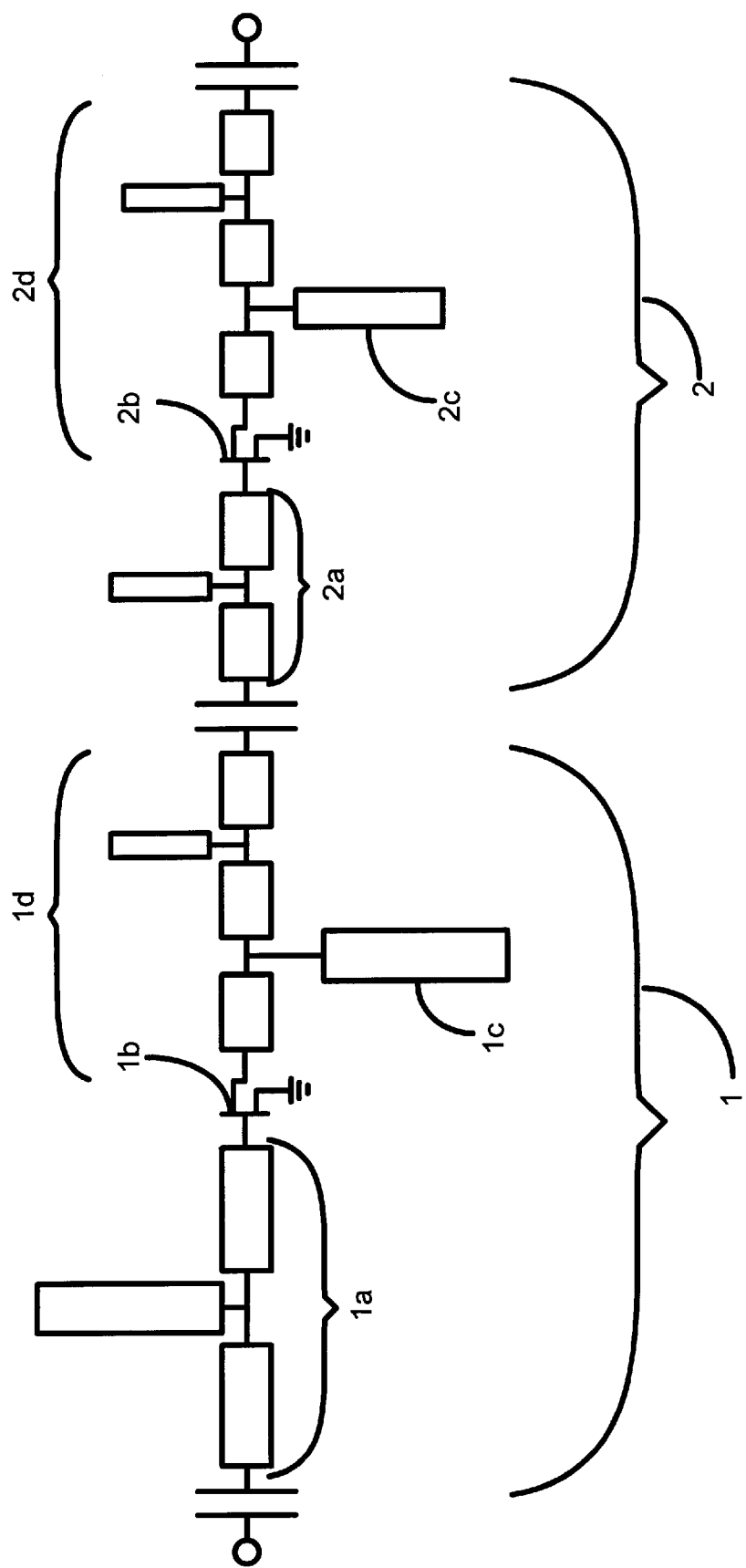
FIG. 1 shows a prior art frequency multiplier consisting of two frequency doubler stages.

Also shown in FIG. 2b is a transmission line section 7 positioned between the preceding transistor 6' and the open stub 1, indicating that the input-signal suppression stub is placed at a distance from the drain 8 of the preceding transistor 6'. However, this section 7 is not necessarily required for all embodiments. In many cases the open stub 1, which is placed as close as possible to the drain 8 of the preceding transistor 6', successfully works as is the case in the embodiment shown in FIG. 3. The entire circuit between the two successive transistor devices 6' and 6, including this section 7, work as the interstage network 20. The interstage network 20 of FIGS. 2a and 2b substitute for a pair of input/output port matching networks 1d and 2a shown in FIG. 1.

This configuration is feasible with frequency doublers using (medium-) power transistors, which can yield conversion gain at successive stages and maintain the driving power at sufficiently high levels. It is useful for multiplying the output frequency of phase-locked loop oscillators in order to provide highly stable, low-phase-noise local frequency sources in microwave and millimeter-wave frequency bands. This apparatus is also useful for multiplying the output frequency of voltage controlled oscillators in order to provide output signals from radar transmitters in microwave and millimeter-wave frequency bands.

In a preferred embodiment, the effect of using a shunt resistor 4 located on the gate of the transistor 6 as stabilization means was tested. Single stage frequency doublers were designed and fabricated for two frequency bands; 7.5/15 GHz and 15/30 GHz. The shunt resistor is monolithically integrated with transistor devices, here HEMTs, on a single semiconductor wafer along with other network elements such as transmission lines and capacitors. For instance, in the 7.5/15 GHz doubler, a 500-ohm resistor is fabricated using a resistive metallic thin film, which is 30 micron wide and 100 micron long. This resistor is shunted to the ground by a following capacitor and a "via" hole. This shunt resistor was found to reduce the magnitude of the voltage reflection coefficient, seen from the gate to the device, to 0.876. Then the input matching network is designed so as to attaint the conjugate impedance matching. With this design, no oscillation was experimentally observed during the operation of the frequency doublers; thus the circuits are well stabilized.

Figure 3:
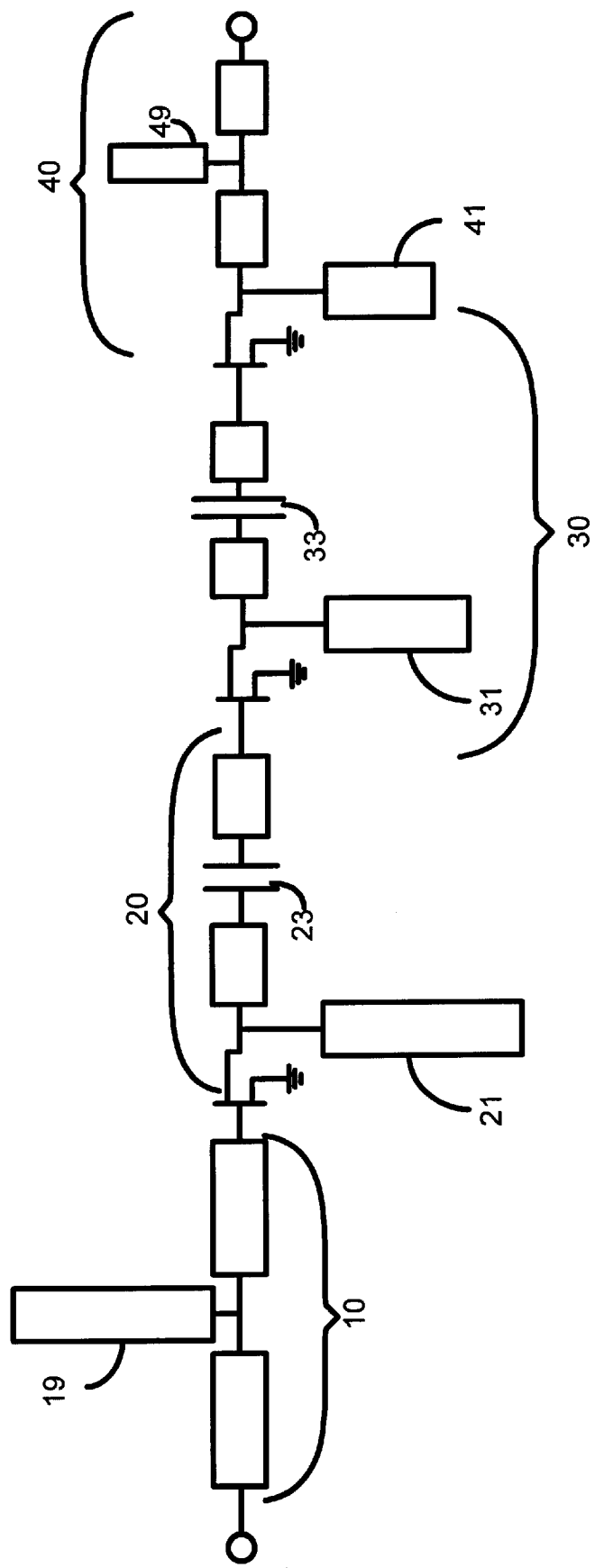

FIG. 3 shows an embodiment of a three-stage frequency multiplier configuration in accordance with the invention. This consists of an input-port matching network 10 for the fundamental frequency, first and second interstage matching networks 20 and 30 for the second and the fourth harmonic frequencies respectively, and the output-port matching network 40 for the eighth harmonic frequency. Open-minded stubs 19 and 49 are used for the input-port matching network 10 and the output-port matching network 40, respectively. The shunt resistor 4 shown in FIG. 2b is not used in this embodiment. A characteristic impedance of 50 ohm is used for the interstage transmission line.

The valve for capacitors 23 and 33 is chosen so as to be close to short circuited for the radio frequencies being considered. In this embodiment, 10 pF chip capacitor is used due to its comparable size with the transmission line width, although its impedance is several ohms for the fundamental frequency (for the higher-order harmonics, the impedance gets close to 0 ohm) and the effect is taken into account for design. The length of stubs 21, 31 and 41 is approximately a quarter of the corresponding wavelength (fundamental, second and fourth harmonics respectively), where the term "wavelength" is used to refer to the effective wavelength, the geometrical structure of the microstrip line taken into account.

In order to achieve efficient frequency doubling, the transistor is biased either near the forward conduction point or the pinchoff, where the device behaves as a half-wave rectifier. The pinchoff bias operation is adopted for less DC power consumption, and also for keeping lower frequency harmonics from being amplified. When the bias voltage at the gate of each transistor is kept below the pinchoff bias, the channel between the source and the drain is entirely blocked, hence no current flowing through the respective drain-to-source channel. Then with sinusoidal input signal, the transistor is turned on only during the positive half-cycles of the drive waveform, thereby generating a second-harmonic frequency component efficiently.

In a preferred embodiment, the apparatus includes microstrip lines on a 250-μm thick Alumina substrates mounted on metallic carriers. Medium power devices used are Fujitsu™ FSX52X, commercially available 600-μm MESFET, for the first-stage doubler, and GaAs-based 500 μm PHEMTs from Northrop Grumman Corporation for the second and third stage. This design is based on the small-signal scattering parameters (S parameters), which are defined by the ratios of the incident wave over the reflected wave. For example, in the case of 2-port networks having of an input port and an output port, a scattering parameter $S_{11}$ is defined as the ratio of the reflected wave to the incident wave at the input port, when the output port is terminated to the characteristic impedance of the transmission line. Similarly, another scattering parameter $S_{22}$ is defined as the ratio of the reflected wave to the incident wave at the output port when the input port is terminated to the characteristic impedance of the transmission line. These parameters are often referred to as "small-signal" in comparison with large-signal behaviors where nonlinear phenomena dominate. Small-signal S parameters for designing multipliers, which make use of nonlinear behaviors, are often used in a preliminary approach when large-signal characteristics of devices are unknown. On the output side of each transistor device is placed a quarter wavelength open-ended stub for suppressing the input frequency signal to each stage. Each transistor device is biased at pinchoff for the efficient second harmonic generation. Because of the quarter wavelength open-ended stub being connected on the output side of the transistor device, $S_{11}$ for the input frequency, seen from the gate toward the transistor, changes to $S_{11}'$ in accordance with the following formulas:

$$S_{11}'=S_{11+\Delta}$$

$$\Delta=S12S_{21}I_{L/}(1-S_{22}I_L)$$

$$I_{L=exp}(-j2\theta).$$

Here, θ is the electrical length from the drain to the position where the quarter wavelength open-ended stub is located. When the angle arg (Δ) happens to be close to the angle arg ($S_{11}$), then the magnitude $|S_{11}'|$ becomes maximum. This magnitude could be close to or more than unity for medium-power FETs, whose input impedance is relatively small and hence $|S_{11}|$ is relatively large. For instance, $|S_{11}|$ of the FSX52X device 0.871 at a fundamental frequency $f_0$ of 3.5 GHz, while $|S_{11}'|$ is increased to 0.949 when θ is substantially zero. Similarly, $|S_{11}|$ of the Northrop Grumman 500 μm PHEMT device is 0.937 at the second harmonic frequency $2f_0$ of 7 GHz, while $|S_{11}'|$ is 1.003. $|S_{11}|$ at the fourth harmonic frequency $4f_0$ of 14 GHz, of the same device is 0.921 and its $|S_{11}'|$ is 1.054. Here, $|S_{22}|$ for the preceding device is sufficiently smaller than unity and yet not significantly different from $|S_{11}|$; $|S_{11}|$ of the Northrop Grumman PHEMT device is 0.782 at 7 GHz and is 0.839 at 14 GHz. In this embodiment, leaving the magnitudes as they are, the phases of the reflective coefficients are matched by selecting the appropriate electrical length of each interstage section which consists of transmission lines with 50 ohm characteristic impedance and a DC block capacitor. The above S parameters are based on the typical measured data of each indicated type of transistor devices, which are acquired through the measurement of several devices from each type. Large-signal characterization of the Northrop Grumman devices was also made using automatic mechanical tuners, which were placed on the input and output terminals; they were varied while a large-signal incident wave was applied, and thus the input and output impedances were tuned so that the most efficient second harmonic generation would be obtained. The magnitudes of the large-signal $S_{11}$ And $S_{22}$ for 14 GHz, evaluated to correspond to the optimum impedances, were found to the smaller than those of small-signal parameters, and this is a favourable condition in terms of stabilization.

A suitable non-zero value of the electrical length θ is one that provides a most effective suppression of the input frequency component of $2^{(k-1)}f_0$ and a most effective generation of the harmonic frequency component of $2^k f_0$. This is done using known approaches such as described in:

C. Rauscher, "High-frequency double operation of GaAs field-effect transistors," IEEEE Trans. Microwave Theory Tech., vol. Mtt-31pp. 462–473, June 1983.

In practice, however, a substantially zero value for θ for pinchoff operation is found to be suitable, which means the drain is short-circuited for the input frequency component.

The following provides a general expression for determining the appropriate electrical parameters of the transmission line section in terms of its characteristic impedance and electrical length between the k' th and the (k+1)'th device. Suppose the output impedance of the k' th device for the harmonic frequency of $2^k f_0$, $f_0$ being the fundamental frequency, is expressed by $R_k+jX_k$, and the input impedance of the (k+1)'th device for the same frequency is expressed as $R_{k+1}+X_{k+1}$, then the appropriate characteristic impedance, $Z_{k,k-1}$, and electrical length between k' th and the (k+1)'th device, $L_{k,k+1}$, are expressed by the following:

$$Z_{k,k+1}{}^2=(X_k{}^2R_{k+1}-X_{k+1}{}^2R_k)/(R_k-R_{k+1})+R_kR_{k+1}$$

and $$L_{k,k+1}=(\lambda_g 2\pi) \arctan((R_k-R_{k+1})(Z_kX_{k+1}-X_kR_{k+1})),$$

where $\lambda_S$ is the effective wavelength. Since "arctan" is a periodic function with a period of π, it takes values from 0 to π when positive values are supposed, resulting that $L_{k,k+1}$ is at most $\lambda_g/2$. Since here $Z_{k,\ k+1}$ is supposed to be a real number, these formulas have a solution only when the right hand of the first formula is positive. This value becomes negative for the Northrop Grumman PHEMT device at 14 GHz, for instance, hence only the phase was conjugately matched in this embodiment.

When the parameters of the interstage network are selected as above, the circuit is conjugately matched for the harmonic frequency of $2^k f_0$. Suppose that the impedance, seen from a point on the interstage network to the direction of the n'th device is expressed by $Z_{out,k}$, and the impedance network to the direction of the (k+1)'th device is expressed by $Z_{m,k+1}$, this matching condition is then expressed by $Z_{out,k}=Z_{in,\ k+1}$. This is good at any point on the interstage network. If we express using reflection coefficients, then $S_{22,k}=S_{11,\ k+1}$. In polar presentation, $|S_{22,k}|=|S_{11,\ k+1}|$ and arg $(S_{22,\ k})$=arg $(S_{11n\ k+1})$.

Although what is described above provides a general approach, a preferred embodiment is so designed that only the phase conjugate condition, arg $(S_{22,k})$=-arg $(S_{11,\ k+1})$ is valid. In other words, the phases of the reflection coefficients seen in opposite directions have the same values but with the opposite polarities. The magnitude of $Z_{k,+1}$ is chosen as 50 ohm and the lengths as $L_{1,2}$=0.310$\lambda_g$ and $L_{2,3,}$=0.137$\lambda_g$. An extra section having a length of 0.5 $\lambda_g$ is added to the second interstage network just for the convenience of MIC fabrication.

Figure 4A:
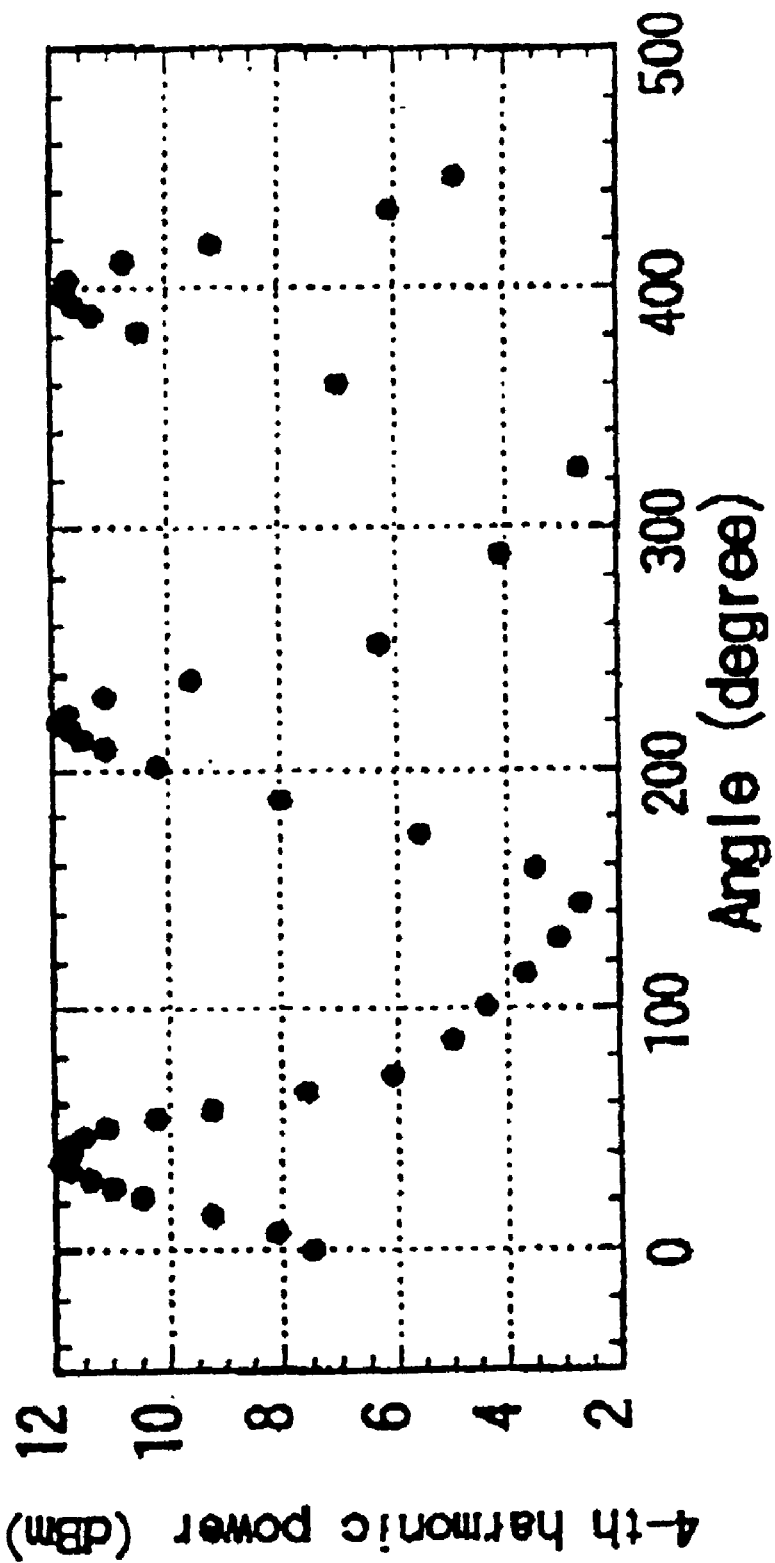
FIG. 4a illustrates in a graph measured fourth harmonic output power versus angle between two frequency doublers in accordance with the invention.
Figure 4B:
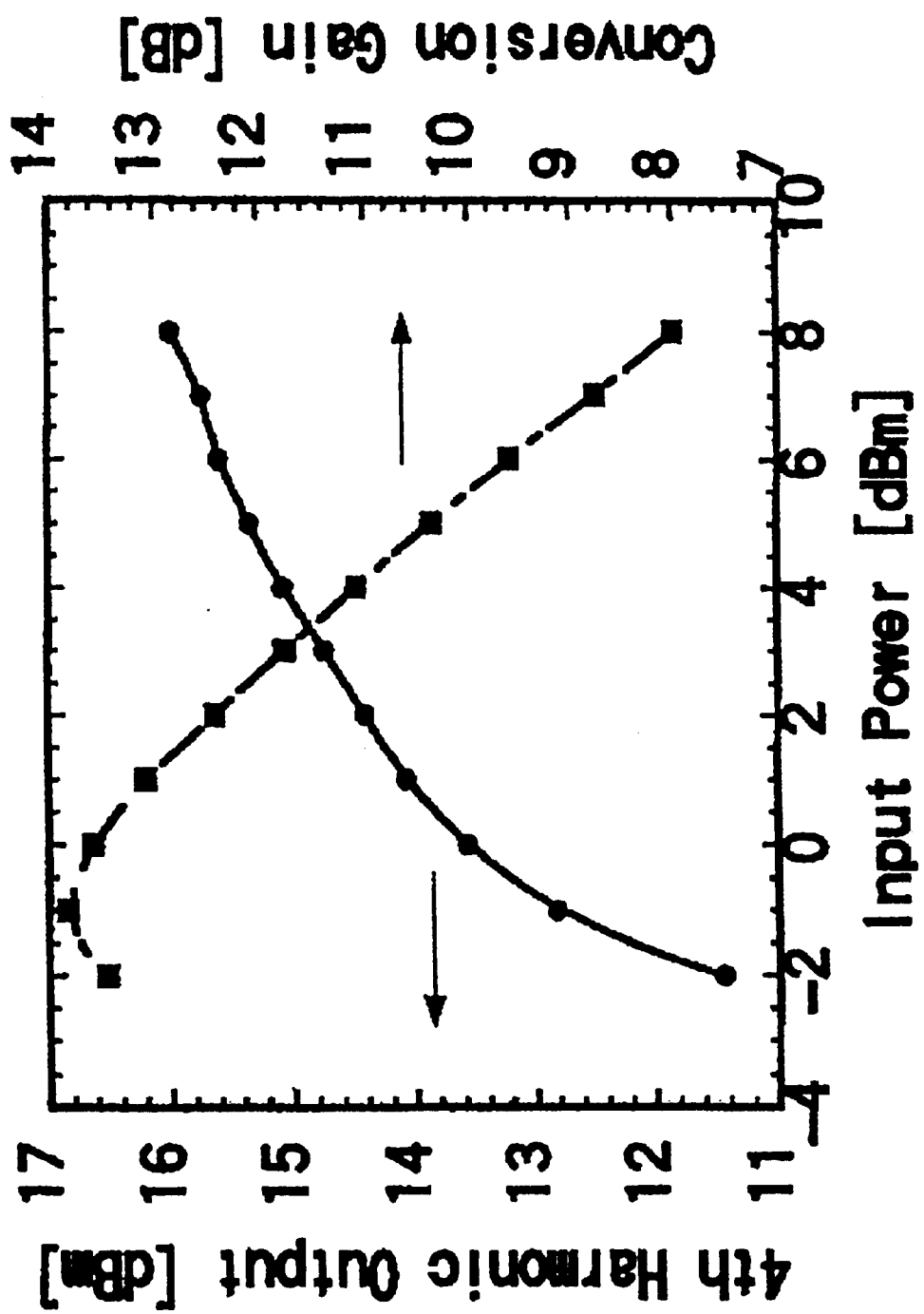
FIG. 4b illustrates in a graph measured fourth harmonic output power and conversion gain versus input power in a two-stage multiplier in accordance with the invention.

A frequency quadrupler embodiment (not shown) with two stages of frequency doubling was constructed for testing purposes from an input matching network for the fundamental frequency, and two interstage matching networks as described above (the second interstage network does not work as such for here). The two stages of frequency doubling were provided with only a fundamental frequency suppression stub on their output port. During testing of the doubling circuits, a phase shifter was placed between the two circuits, and the phase angle was mechanically varied. the fourth harmonic power varied by 9 dB with a period of 180 degress as shown in FIG. 4(a). Here, the fundamental frequency is 3.6 GHz and the input power is 6 dBm. The phase difference between the angles which gave 1 dB less output power than the maximum level was 25 degrees. This relatively phase-intensive feature is advantageous for design. The tested quadrupler embodiment, incorporating interstage impedance matching, had a 14.25 GHz output frequency. Measured forth harmonic output power and the conversion gain of this quadrupler is shown in FIG. 4b as a function of input power. A maximum conversion gain of 13.8 dB was obtained for an input power of −1 dBm. FIG.

Figure 4C:
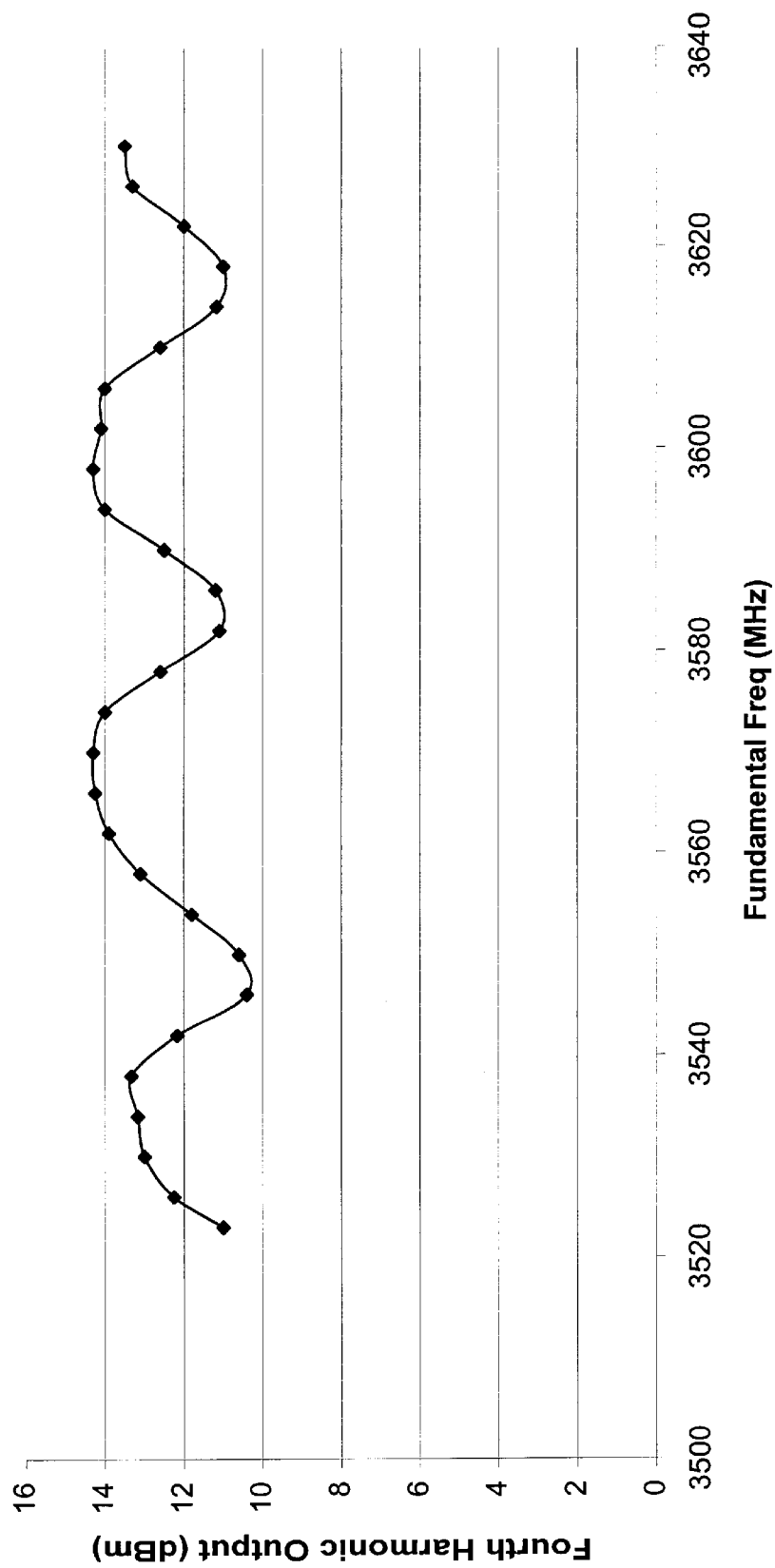
FIG. 4c illustrates in a graph measured fourth harmonic output power versus fundamental frequency.
Figure 5:
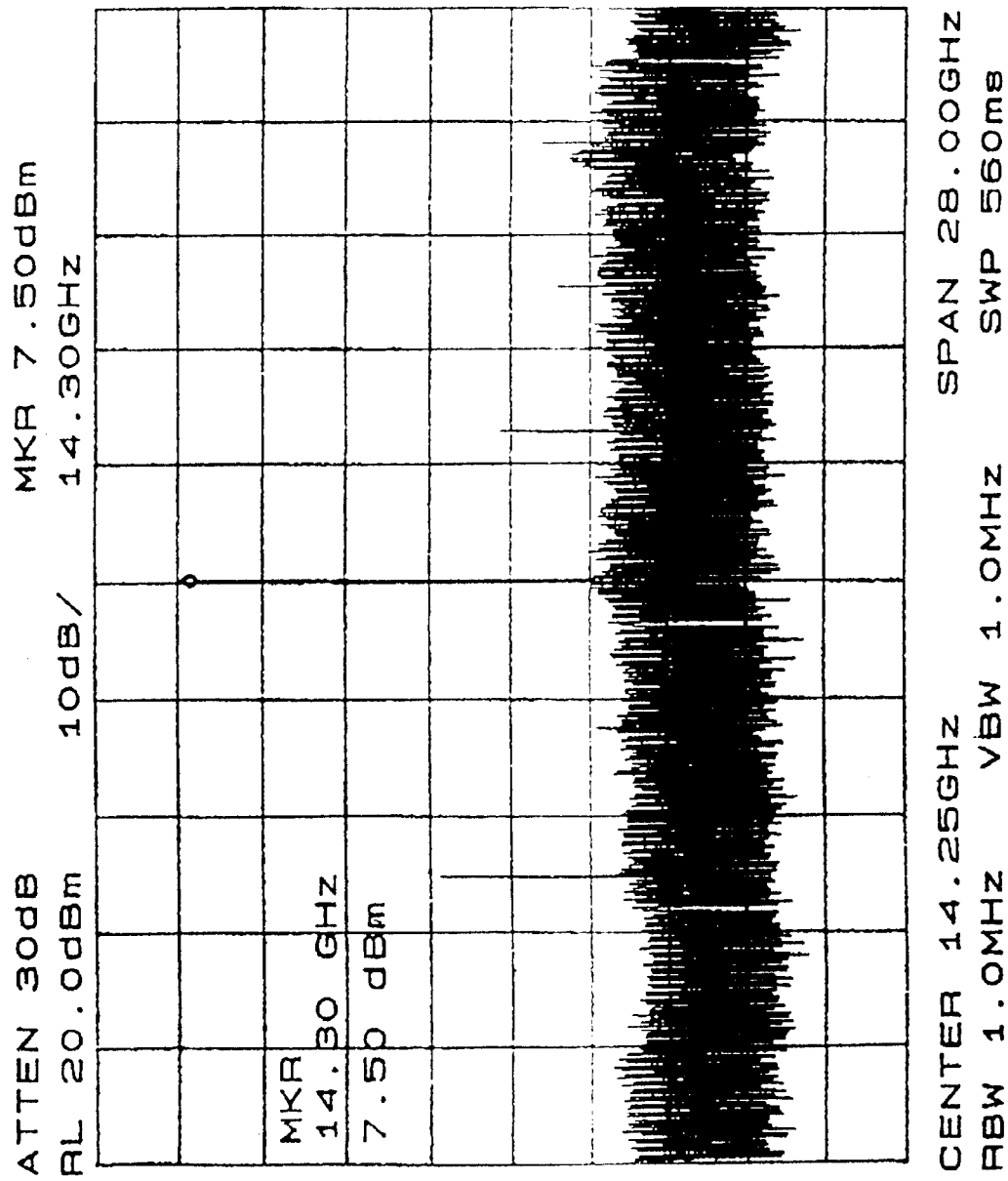
FIG. 5 illustrates in a graph for suppression of unwanted harmonies in a two-stage multiplier embodiment of this invention.
Figure 6:
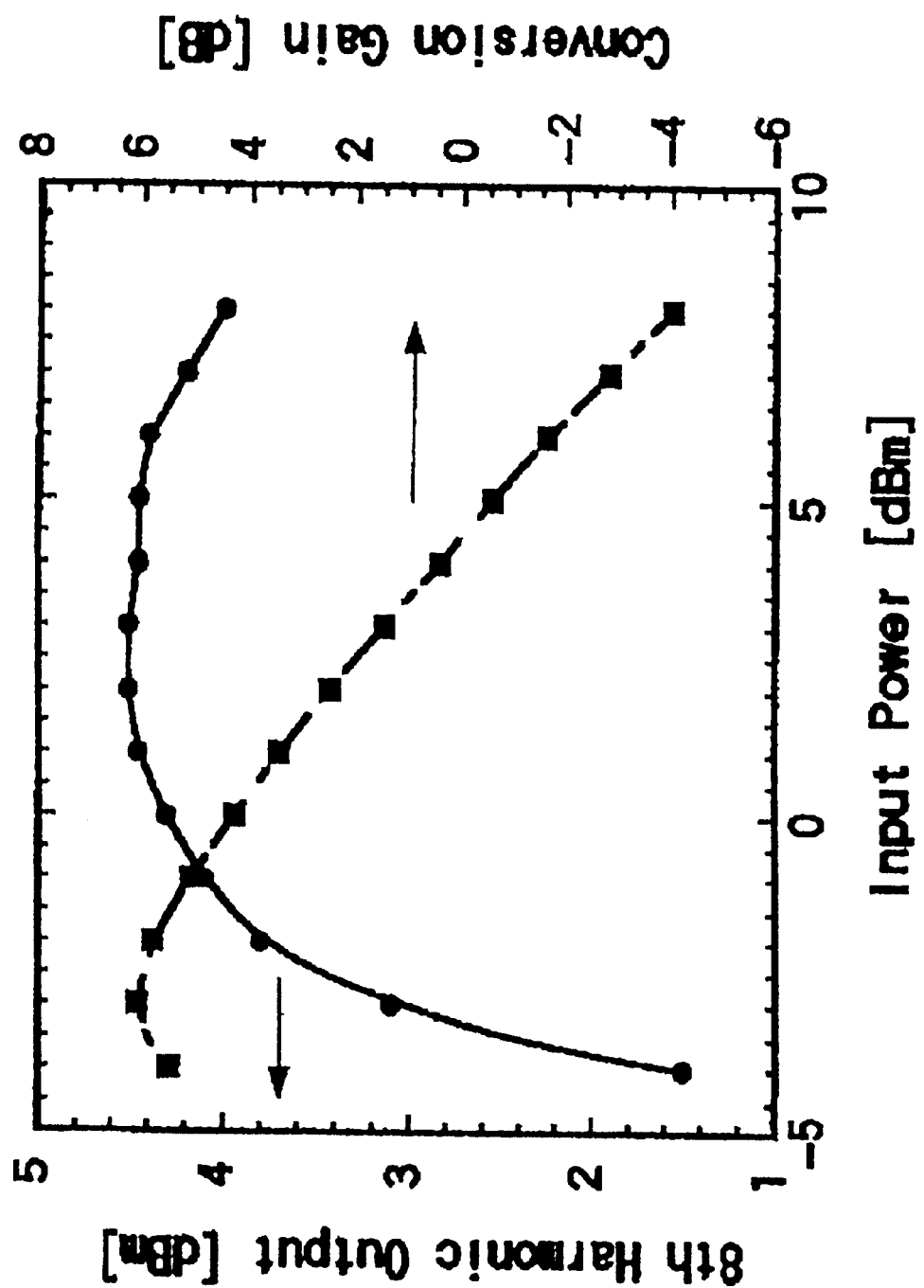
FIG. 6 illustrates in a graph eighth harmonic output power and conversion gain versus input power for the three-stage multiplier of FIG. 2b.

4(c) shows the fourth harmonic power as a function of the fundamental frequency when the input power is 1.5 dBm. The output power is reflected by the frequency dependency of the measurement system which is illustrated in FIG. 4c. The variation would be less when the system is calibrated. As shown in FIG. 5, with a vertical scale of 10 dB per division indicated at the top of the figure, the unwanted harmonics were suppressed to less than −40dBc compared to the fourth harmonic, except for the second (−27dBc) and the fifth (−35dBc) harmonics. This two-stage frequency multiplier, although having the output matching network omitted, exhibited a pretty good performance. With an output matching stub as described above, the performance is expected to be even better. When a third transistor device and an output-port matching network for the eighth harmonic is combined with this quadrupler, a three-stage multiplier is obtained. Measured eighth harmonic output power versus input power for such a combination is shown in FIG. 6. The preferred multiplier shows a maximum conversion gain of 6.1 dB for the input power of −3 dBm. The output power of 4.3 dBm was obtained for 0 dBm input power. The total DC power consumption was 257 mW when the input power is 2 dBm. Since the input power to the third transistor device is more than 10 dBm, the networks related to the third frequency doubling, i.e. the second interstage network and the output matching network, are not properly realized when designed using small-signal S parameters. The performance is expected to be even better by incorporating large-signal parameters.

of course, numerous variations and adaptations may be made to the particular embodiments of the invention described above, without departing from the spirit and scope of the invention, which is defined in the claims.

What is claimed is:

1. A method of frequency multiplication comprising the steps of:
   (a) receiving an input signal having a fundamental frequency of component $f_0$;
   (b) providing an input impedance matching to said fundamental frequency component;
   (c) performing a plurality of n frequency doubling operations in series to derive from the input signal an output signal having an output frequency component of $2^n f_0$, wherein each frequency doubling operation, hereby referred to as a k' th doubling operation k≤n, includes the steps of
      receiving a k' th input signal having an input frequency component of $2^{(k-1)} f_0$,
      deriving from the k' th input signal a k' th intermediate signal having a harmonic frequency component of $2^k f_0$,
      suppressing the input frequency component of $2^{(k-1)} f_0$ from the intermediate signal; and
   (d) providing an interstage impedance matching to the harmonic frequency component of $2^k f_0$ between each pair of consecutive k' th and (k+1)' th frequency doubling operations; the interstage impedance matching being provided by a transmission line having electrical parameters so set as to provide a pair of reflection coefficients on the transmission line having phases of similar values and opposite polarities, when seen in opposite directions to one another at the harmonic frequency component of $2^k f_0$; and
   (e) providing an output impedance matching to the output frequency component of $2^n f_0$.

2. A method as in claim 1, wherein at least one of the frequency doubling operations is performed by using a three-terminal transistor device.

3. A method as in claim 1, wherein the step of suppressing said input frequency component is performed by a quarter-wavelength open-ended stub.

4. A method as in claim 1, wherein at least one of the frequency doubling operations further includes a step of signal stabilization after the step of receiving the input signal.

5. A method as in claim 1, wherein the pair of reflection coefficients have substantially the same magnitude.

6. A multistage frequency multiplier comprising in a series configuration;
   (a) an input network for receiving an input signal having a fundamental frequency component of $f_0$ and for providing impedance matching to said fundamental frequency component;
   (b) a plurality of n frequency doublers to derive from the input signal an output signal having an output frequency component $2^n f_0$, wherein each frequency doubler, hereby referred to as k' th doubler k≤n, comprises
      means for receiving a k' th input signal having an input frequency component of $2^{(k-1)} f_0$, and deriving from said input signal a k' th intermediate signal having a harmonic frequency component of $2^k f_0$, and
      means for suppressing said input frequency component from the intermediate signal;
   (c) a plurality of n-1 interstage networks, each positioned between a pair of adjacent k' th and (k+1)'th frequency doublers to provide an interstage impedance matching to the harmonic frequency component $2^k f_0$; at least one of the interstage networks comprises a transmission line having electrical parameters that are selected such that a pair of reflection coefficients on the respective interstage network seen in opposite directions to one another have phases of similar values and opposite polarities; and
   (d) an output network for impedance matching to the output frequency component of $2^n f_0$.

7. A frequency multiplier as in claim 6, wherein n=3, thereby the output frequency component is $8f_0$.

8. A frequency multiplier as in claim 6, wherein at least one of the frequency doublers comprises three-terminal transistor devices.

9. A frequency multiplier as in claim 8, wherein the three-terminal transistor device is a field effect transistor (FET).

10. A frequency multiplier as in claim 8, wherein the three-terminal transistor device is a high electron mobility transistor (HEMT).

11. A frequency multiplier as in claim 8, wherein the suppressing means is a quarter-wavelength open-ended stub positioned from the transistor device output terminal by an electrical length suitable to provide a most effective suppression of the input frequency component of $2^{(k-1)} f_0$ and a most effective generation of the harmonic frequency component of $2^k f_0$.

12. A frequency multiplier as in claim 8, wherein the suppressing means is a quarter-wavelength open-ended stub positioned by a substantially zero electrical length from the transistor device output terminal.

13. A frequency multiplier as in claim 6, wherein at least one of the frequency doublers is preceded by stabilization means.

14. A frequency multiplier as in claim 13, wherein the stabilization means is a shunt resistor.

15. A frequency multiplier as in claim 6, wherein n=2, thereby the output frequency component is $4f_0$.

16. A frequency multiplier as in claim 6, wherein the electrical parameters include a combination of a characteristic impedance and an electrical length that are set to make the pair of reflection coefficients have substantially the same magnitude.

17. A frequency multiplier as in claim 16, wherein the characteristic impedance of the transmission line is substantially 50 ohms.

18. A frequency multiplier as in claim 6, wherein the transmission line is a microstrip line.

* * * * *

UNITED STATES PATENT AND TRADEMARK OFFICE
CERTIFICATE OF CORRECTION

PATENT NO. : 6,388,546 B1
DATED : May 14, 2002
INVENTOR(S) : Kiyokawa et al.

It is certified that error appears in the above-identified patent and that said Letters Patent is hereby corrected as shown below:

Title page,
Item [75], correct the spelling of the first inventor's name:
-- [75] Inventors: Masahiro Kiyokawa, Tokyo, (JP); --

Signed and Sealed this

Eleventh Day of February, 2003

JAMES E. ROGAN
*Director of the United States Patent and Trademark Office*